(12) United States Patent
Kikuchi et al.

(10) Patent No.: US 6,897,117 B2
(45) Date of Patent: May 24, 2005

(54) METHOD OF MANUFACTURING SEMICONDUCTOR DEVICE

(75) Inventors: Shuichi Kikuchi, Gunma (JP); Masaaki Momen, Ojiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/816,856

(22) Filed: Apr. 5, 2004

(65) Prior Publication Data

US 2004/0183145 A1 Sep. 23, 2004

Related U.S. Application Data

(62) Division of application No. 10/215,188, filed on Aug. 9, 2002, now Pat. No. 6,737,707.

(30) Foreign Application Priority Data

Aug. 10, 2001 (JP) ........................................ 2001-243725

(51) Int. Cl.⁷ ........................... H01L 21/00; H01L 21/48
(52) U.S. Cl. ......................... 438/275; 438/210; 438/58; 438/59; 438/200
(58) Field of Search .......................... 438/275, 59, 200, 438/233, 237, 297, 362, 439, 448.69

(56) References Cited

U.S. PATENT DOCUMENTS

| | | | | |
|---|---|---|---|---|
| 5,134,085 A | * | 7/1992 | Gilgen et al. ............... | 438/210 |
| 5,742,095 A | * | 4/1998 | Bryant et al. ............... | 257/647 |
| 5,830,771 A | * | 11/1998 | Fukatsu et al. .............. | 438/257 |
| 5,894,059 A | * | 4/1999 | Peidous et al. .............. | 430/316 |
| 6,054,374 A | * | 4/2000 | Gardner et al. .............. | 438/528 |
| 6,221,737 B1 | * | 4/2001 | Letavic et al. .............. | 438/439 |
| 6,399,448 B1 | * | 6/2002 | Mukhopadhyay et al. .. | 438/275 |
| 6,476,448 B2 | * | 11/2002 | Yeh et al. .................... | 257/351 |
| 6,495,391 B1 | * | 12/2002 | Chan ........................... | 438/59 |
| 6,504,213 B1 | * | 1/2003 | Ebina .......................... | 257/347 |
| 6,538,282 B1 | * | 3/2003 | Kanamori .................... | 257/347 |
| 6,552,395 B1 | * | 4/2003 | Buynoski ..................... | 257/347 |
| 6,613,659 B2 | * | 9/2003 | Kikuchi et al. ............. | 438/591 |
| 6,737,707 B2 | * | 5/2004 | Kikuchi et al. ............. | 257/347 |

FOREIGN PATENT DOCUMENTS

| | | |
|---|---|---|
| JP | 8-125026 | 5/1996 |
| JP | 9-64193 | 3/1997 |
| KR | 1999-51079 | 7/1999 |

* cited by examiner

Primary Examiner—Michael Lebentritt
(74) Attorney, Agent, or Firm—Morrison & Foerster LLP

(57) ABSTRACT

A transistor of a semiconductor device has an increased driving capacity. The semiconductor device has a first gate insulation film formed by a selective oxidation, a second gate insulation film formed by thermal oxidation and a gate electrode formed across the first and the second gate insulation films. The second gate insulation film is composed of a thicker gate insulation film and a thinner gate insulation film.

6 Claims, 5 Drawing Sheets

METHOD OF MANUFACTURING SEMICONDUCTOR DEVICE

REFERENCE TO THE RELATED APPLICATION

This application is a division of Ser. No. 10/215,188, filed Aug. 9, 2002, now U.S. Pat. No. 6,737,707.

BACKGROUND OF THE INVENTION

1. Field of the Invention

This invention relates to a semiconductor device and its manufacturing method, specifically to a high voltage MOS (Metal Oxide Semiconductor) transistor with an increased driving capacity for a level shifter used in an LCD (Liquid Crystal Display) driver, an EL (Electro Luminescence) driver and the like.

2. Description of the Related Art

A semiconductor device according to a conventional art will be explained hereinafter referring to a cross-sectional view of an LOCOS (Local Oxidation of Silicon) offset type high voltage MOS transistor shown in FIG. 9.

A gate electrode 53 is formed on a first gate insulation film 52A and a second gate insulation film 52B on a semiconductor layer 51 of a first conductivity (P-type in this example), as shown in FIG. 9. An N+ source region 54 is formed adjacent one edge of the gate electrode 53. An N– drain region 56 is formed facing to the N+ source region 54 across a channel region 55. And an N+ drain region 57 is formed within the N– drain region 56 and apart from the other edge of the gate electrode 53. A numeral 58 refers to a device isolation film.

The second gate insulation film 52B is thicker than the gate insulating film of a normal voltage (e.g. 10V) MOS transistor. That is to say, for instance, the gate insulation film of the high voltage MOS transistor is about 120 nm thick while that of the normal voltage MOS transistor is about 15 nm thick.

A LOCOS insulation film (the second gate insulation film 52B) is formed on the N– drain region in order to increase a maximum voltage applicable to the device by relieving an electric field concentration in that area.

A weak inversion leakage current increases when the gate insulation film becomes thicker. Therefore raising a threshold voltage by forming an ion-implanted layer in the channel region is necessary in order to suppress the leakage current.

However, on the other hand, when the threshold voltage is raised, a driving capacity of the transistor is reduced.

SUMMARY OF THE INVENTION

This invention is directed to a semiconductor device with improved driving capacity and its manufacturing method.

The semiconductor device of this invention has a gate electrode formed on a gate insulation film on a semiconductor layer, and source and drain regions formed adjacent the gate electrode, while the gate insulation film has three or more different thicknesses.

The semiconductor device of this invention has a first gate insulation film formed by a selective oxidation and second gate insulation film formed by a thermal oxidation on the semiconductor layer. The gate electrode is formed across the first and the second gate insulation film, wherein the second gate insulation film consists of a plurality of gate insulation films of different thicknesses.

The second gate insulation film consists of a thicker second gate insulation film and a thinner second gate insulation film, and the first gate insulation film is thicker than the thicker second gate insulation film.

In a manufacturing process of the semiconductor device of this invention, which has the first gate insulation film formed by a selective oxidation and the second gate insulation film formed by a thermal oxidation of the semiconductor layer and the gate electrode formed across the first and the second gate insulation films, the second gate insulation film is formed in the following steps. The thicker second gate insulation film is formed on the semiconductor layer. A predetermined area of the thicker second gate insulation film is removed. Then, the thinner second gate insulation film is formed bordering on the thicker second gate insulation film.

In a manufacturing method of the semiconductor device of this invention, the second gate insulation film can be formed after the first gate insulation film is formed.

In a manufacturing method of the semiconductor device of this invention, the second gate insulation film can be formed before the first gate insulation film is formed.

A manufacturing method of the semiconductor device of this invention has a process to form a LOCOS insulation film by selective oxidation of a semiconductor layer with a mask of an oxidation resistant film formed on the semiconductor layer, a process to form a thicker gate insulation film bordering on the LOCOS insulation film after removing the oxidation resistant film, a process to form a thinner gate insulation film bordering on the thicker gate insulation film by thermal oxidation after removing a predetermined portion of the thicker gate insulation film, a process to form a gate electrode across the thinner gate insulation film, thicker gate insulation film and the LOCOS insulation film and a process to form source and drain regions adjacent the gate electrode.

A LOCOS insulation film is formed by selective oxidation of the semiconductor layer using an oxidation resistant film as a mask, after forming an insulation film or an insulation film and a polysilicon film on the semiconductor layer.

DETAILED DESCRIPTION OF THE INVENTION

Figure 1:
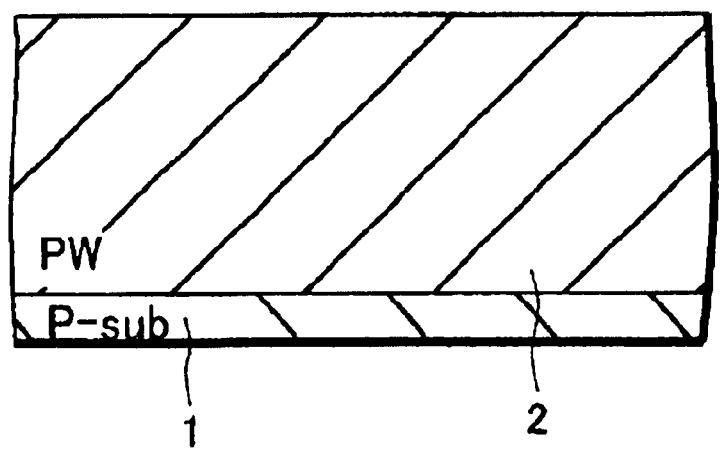
FIG. 1 is a cross-sectional view showing a device intermediate according to a manufacturing method of a semiconductor device of an embodiment of this invention.

A semiconductor device and its manufacturing method of an embodiment of this invention, applied to an N-channel MOS transistor for a level shifter, will be explained referring to the drawings.

A manufacturing method of the semiconductor device will be explained hereafter.

As shown in FIG. 1, a P-type semiconductor layer 2 is formed on a semiconductor (Si) substrate 1 of a first conductivity, e.g. P-type by a boron-ion implantation of $1\times10^{13}/cm^2$ at an acceleration voltage of 80 KeV and a diffusion of the boron ions at about 1200° C. for 8 hrs in a $N_2$ atmosphere.

Figure 2:
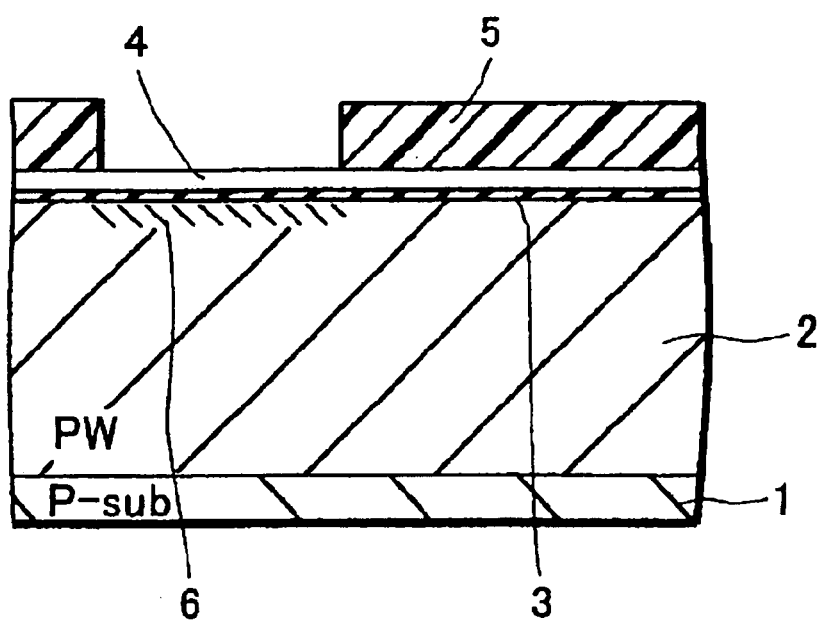
FIG. 2 is a cross-sectional view showing a device intermediate according to the manufacturing method of the semiconductor device of the embodiment, following the step of FIG. 1.

As shown in FIG. 2, about 15 nm of an insulation film 3 and about 50 nm of a polysilicon film 4 are formed on an entire surface of the substrate, and then N-type impurities, e.g. $7\times10^{12}/cm^2$ of phosphorous ions, are implanted at an acceleration voltage of 140 KeV with a mask of photo-resist 5 formed on the polysilicon film 4. With this, an ion implanted layer 6 is formed in a region to make the drain of the N-channel MOS transistor for the level shifter. The insulation film 3 and the polysilicon film 4 are so called pad oxide film and pad polysilicon film for the LOCOS insulation film formation, which will be described later.

Figure 3:
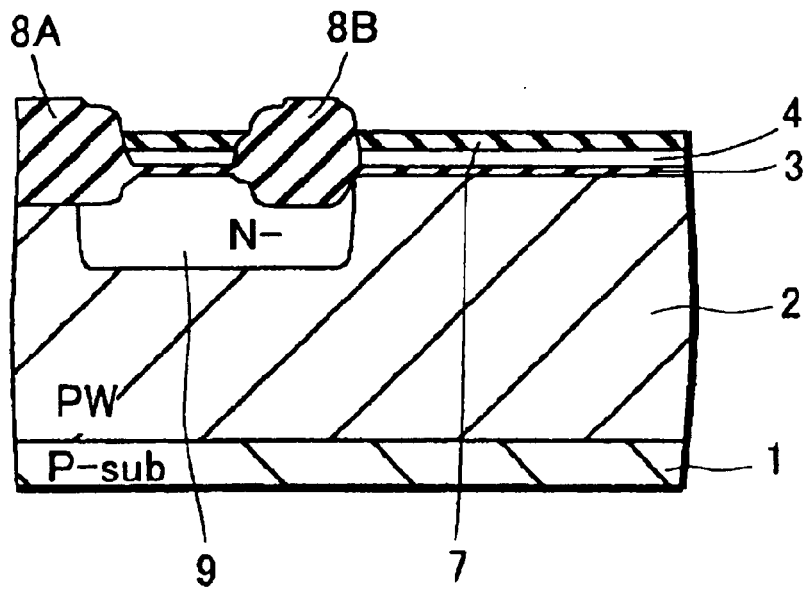
FIG. 3 is a cross-sectional view showing a device intermediate according to the manufacturing method of the semiconductor device of the embodiment, following the step of FIG. 2.

Next as shown in FIG. 3, a device isolation film 8A and a first gate insulation film 8B, both made of the LOCOS insulation film, are formed by a selective oxidation of the substrate with a mask of a silicon nitride film 7 formed on the polysilicon film 4. The impurities in the ion-implanted layer 6 are diffused to form a low impurity concentration drain region (N– layer) 9 during the selective oxidation. The LOCOS insulation film may also be formed using only the pad oxide film, rather than using both the pad polysilicon film and the pad oxide film.

Figure 4:
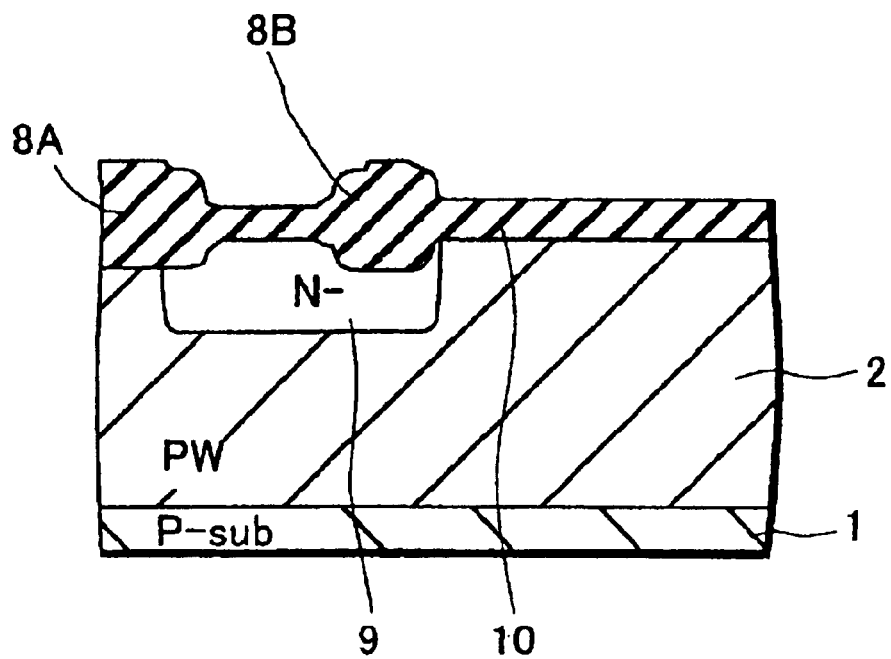
FIG. 4 is a cross-sectional view showing a device intermediate according to the manufacturing method of the semiconductor device of the embodiment, following the step of FIG. 3.

Then about 120 nm of thicker gate insulation film 10 (a part of a second gate insulation film) is formed by a pyrolytic oxidation of the surface of the substrate as shown in FIG. 4.

Figure 5:
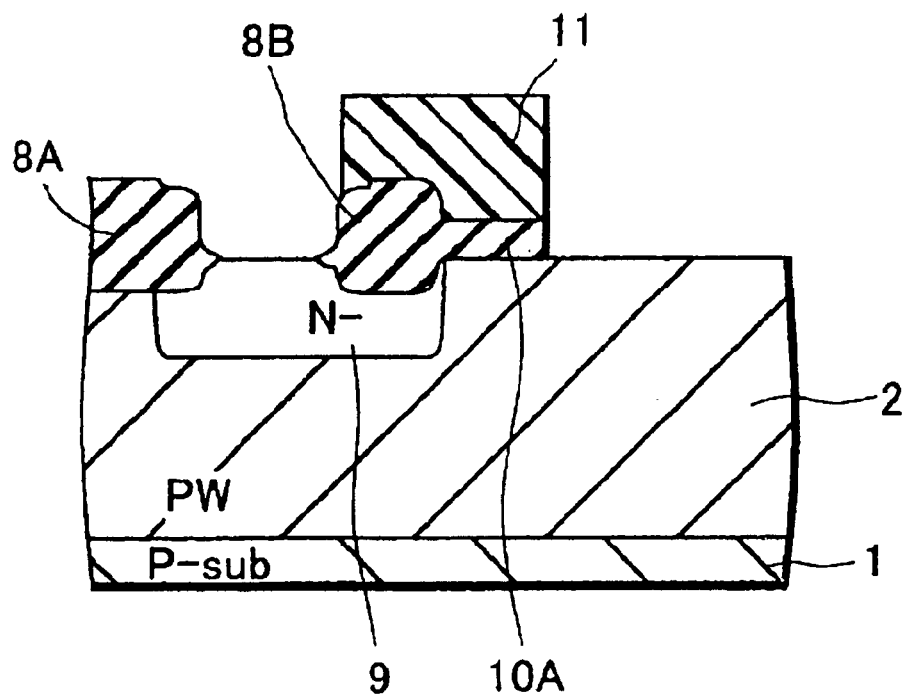
FIG. 5 is a cross-sectional view showing a device intermediate according to the manufacturing method of the semiconductor device of the embodiment, following the step of FIG. 4.

As shown in FIG. 5, a photo-resist film 11 is formed on the first gate insulation film 8B and the thicker gate insulation film 10. Then a part of the insulation film 10, which is not covered by the photo-resist film 11 is removed, leaving thicker gate insulation film 10A adjacent the first gate insulation film 8B.

Figure 6:
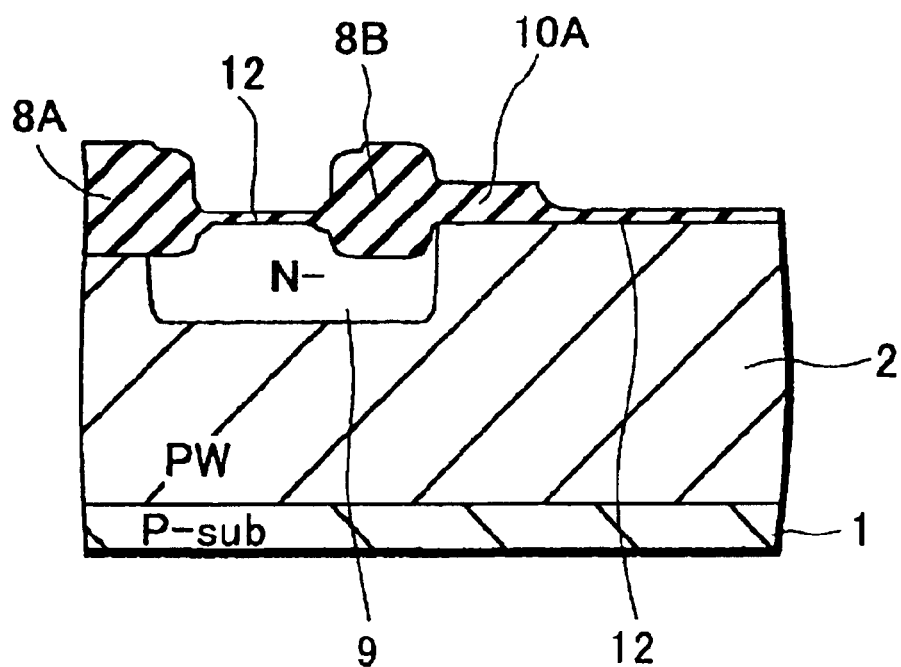
FIG. 6 is a cross-sectional view showing a device intermediate according to the manufacturing method of the semiconductor device of the embodiment, following the step of FIG. 5.

And as shown in FIG. 6, a thinner gate insulation film 12 (the other part of the second gate insulation film) of 15 nm in thickness is formed adjacent the thicker gate insulation film 10A by a pyrolytic oxidation of the substrate at about 850° C. followed by a thermal treatment at 900° C. for 10 min, after removing the photo-resist film 11. The surface layer of the substrate under the gate insulation film 10A is oxidized to increase the thickness of the gate insulation film 10A a little during this process.

P-type impurities for threshold voltage (the voltage of the onset of an inversion layer formation) control, e.g. $1\times10^{12}/cm^2$ of boron ions, are implanted into a portion under the region to form a gate electrode (under the thinner gate insulation film 12) at an acceleration voltage of 35 KeV with a mask of photo-resist film (not shown in the figure).

In this invention as described above, the ion implantation for threshold control is made only to the portion under the thinner gate insulation film 12 and not to a portion under the thicker gate insulation film 10A. Therefore an impurity concentration in the portion of the P-type semiconductor layer 2 under the thicker gate insulation film remains low. Because of this low impurity concentration under the thicker gate insulation film, the maximum drain voltage applicable to the device can be significantly higher than that of the conventional structure. Furthermore, the thicker gate insulation film 10A can withstand a high voltage applied at the gate electrode and, thus, further contributes to a higher maximum voltage applicable to the device.

The portion of the semiconductor layer 2 under the thinner gate insulating film 12 has a low threshold voltage because of the thinner insulation film and, thus, provides a large driving capacity of the device. The level of the threshold voltage is adjusted by the implantation of P-type impurities.

The ion implantation for threshold control can be done with a self aligned method, i.e. not using the photo-resist, taking advantage of a difference in thickness between the gate insulation films 10A and 12. Furthermore, the ion implantation for threshold control can be made to both portions under the gate insulation films 10A and 12. In this case, an impurity concentration profile difference due to the difference in thickness between the gate insulation films 10A and 12 assures a high maximum drain voltage in the portion under the thicker gate insulation film 10A and a threshold voltage controlled at a low level in the portion under the thinner gate insulation film 12.

Figure 7:
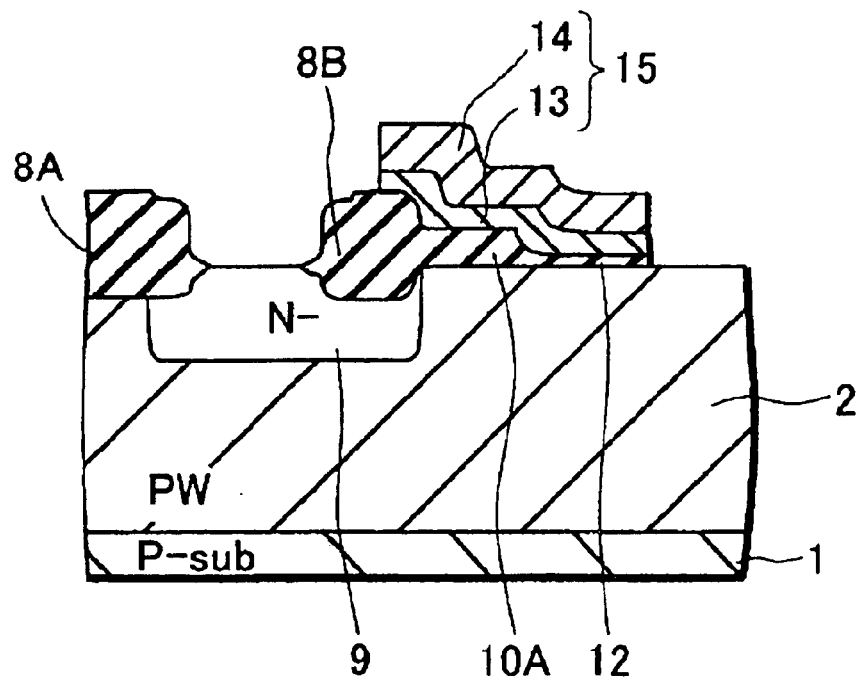
FIG. 7 is a cross-sectional view showing a device intermediate according to the manufacturing method of the semiconductor device of the embodiment, following the step of FIG. 6.

Then, as shown in FIG. 7, a phosphorous-treated polysilicon film having a thickness of about 10 nm and a silicide film (tungsten silicide, WSix, film in this embodiment) having a thickness of about 15 nm are formed on the entire surface of the substrate in this order. These two films are patterned using a mask of photoresist film (not shown in the figure) to form a gate electrode 15 consisting of the tungsten silicide 14 stacked on the polysilicon film 13. Portions of the thinner gate insulation film 12, which is not covered by the gate electrode 15, are, then, removed.

Figure 8:
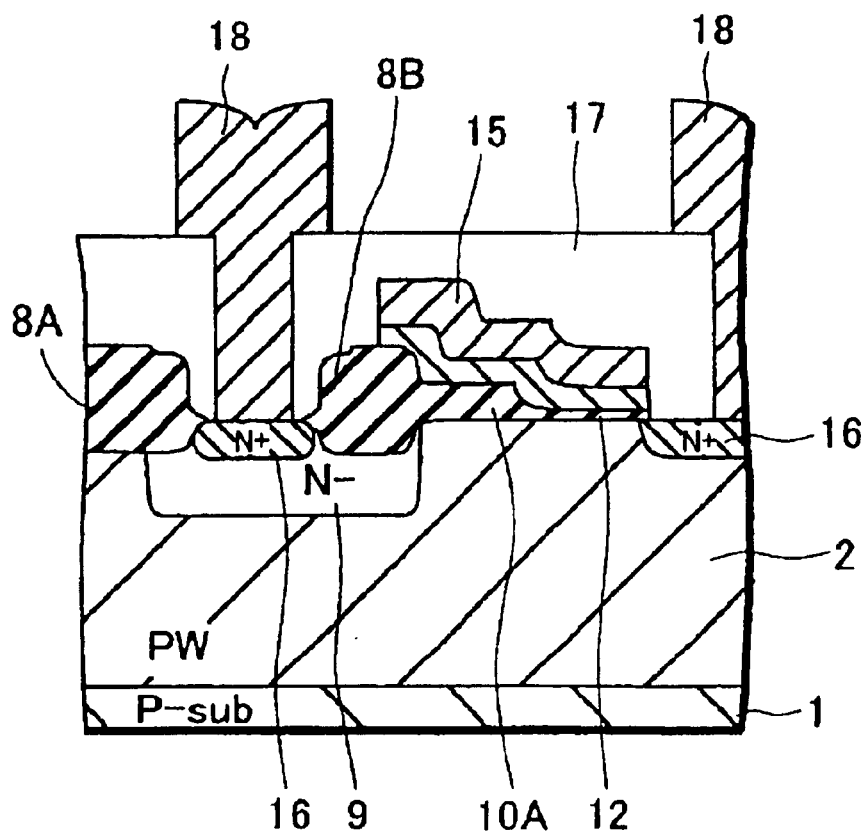
FIG. 8 is a cross-sectional view showing a device intermediate according to the manufacturing method of the semiconductor device of the embodiment, following the step of FIG. 7.
Figure 9:
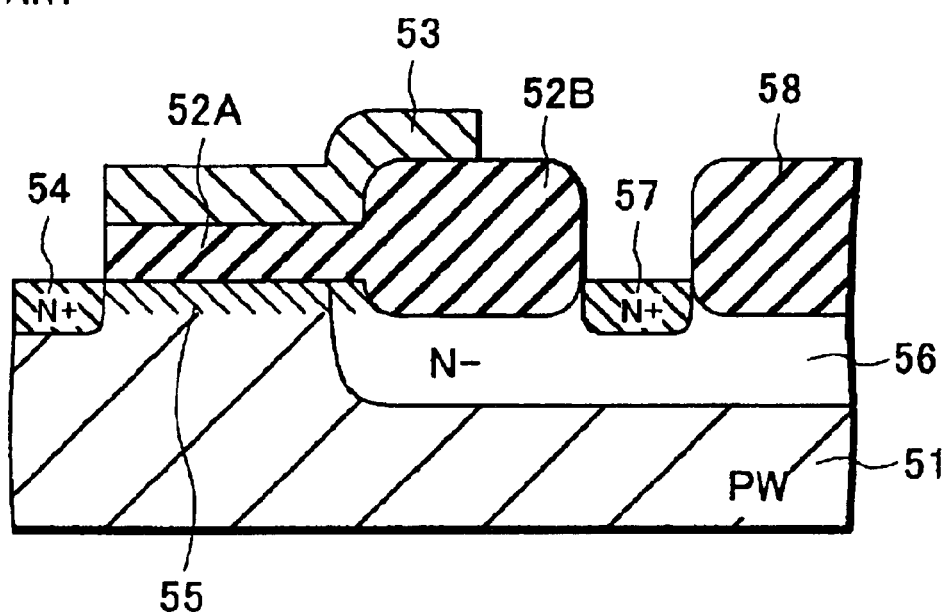
FIG. 9 is a cross-sectional view showing a conventional semiconductor device.

Next as shown in FIG. 8, a high impurity concentration source region (N+ layer) 16 located adjacent on edge of the gate electrode 15 and a high impurity concentration drain region (N+ layer) 16 located in an area apart from the gate electrode 15 through the first gate insulation film 8B are formed by implanting N-type impurities, e.g. $5\times10^5/cm^2$ of arsenic ions, at an acceleration voltage of 70 KeV using the device isolation film 8A, the first gate insulation film 8B and the gate electrode 15 as a mask.

Furthermore, an interlayer insulation film 17, which is a stacked layer of NSG (Non-doped Silicate Glass) film and BPSG (Boro-Phospho Silicate Glass) film in the embodiment, is formed on the entire surface followed by a formation of a metal interconnect (Al film, Al—Si film or Al—Si—Cu film for example) 18, which contacts with the source and the drain regions 16 through contact holes formed in the interlayer insulation film 17.

A passivation film (not shown in the figure) is formed on the entire surface to complete the semiconductor device of this invention.

In the high voltage MOS transistor of the embodiment shown in FIG. 8, to which a high voltage is applied only at a drain, a high maximum voltage applicable to the device is secured in a portion of a thicker gate insulation film 10A by forming a drain side gate insulation film with the thicker gate insulation film 10A, while the threshold voltage is controlled at a low level in a portion of a thinner gate insulation film 12.

Including a LOCOS insulation film 8B which composes a LOCOS offset structure, the gate insulation films are made of three different films, i.e. the thicker gate insulation film 10A, thinner gate insulation film 12 and the LOCOS insulation film 8B. These three film each have different thickness and contribute to relieving electric field concentration.

In this embodiment, as described above, a first gate insulation film 8B made of the LOCOS insulation film is formed first, and thicker gate insulation film 10A (a part of the second gate insulation film) is formed adjacent the first gate insulation film 8B, and a portion of the thicker second gate insulation film 10A is removed, and then the thinner second gate insulation film 12 (the other part of the second gate insulation film) is formed bordering on the thicker second gate insulation film. The order to form each of the insulation films 8B, 10A and 12 is not limited to the order described above, but there are some variations.

That is, the second gate insulation film can be formed before the first gate insulation film, the order to form two films 10A and 10B forming the second gate insulation film can be reversed, the first gate insulation film 8B can be formed between the formations of the two films 10A and 10B and so on.

Additionally, this invention can be applied to a P-channel MOS transistor for a level shifter, although an N-channel MOS transistor for a level shifter is introduced in the embodiment.

Furthermore, this invention is not only applied to an MOS transistor for a level shifter, but also can be applied to an MOS transistor to which a high maximum drain voltage is required in general.

Moreover, this invention is not only applied to a LOCOS offset type semiconductor device, but also can applied to other semiconductor device which secures a high maximum drain voltage while improving a driving capacity of a transistor taking advantage of the difference in thickness of a gate insulation film formed by thermal oxidation.

According to this invention, by forming the gate insulation film with two or more thicknesses, the electric field concentration can be relieved in comparison to the conventional device.

By having a thicker gate insulation film and a thinner gate insulation film disposed on the semiconductor layer, a high maximum drain voltage can be applied to the device because of the thicker gate insulation film while the threshold voltage is controlled at a low level in the portion of the semiconductor layer under the thinner gate insulation film, leading to an improved driving capacity of the transistor.

The above is a detailed description of a particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A method of manufacturing a semiconductor device, comprising:
   providing a substrate;
   forming a first gate insulation film on a semiconductor layer of the substrate by selective oxidation;
   forming a second gate insulation film on the semiconductor layer by thermal oxidation, the second gate insulation film comprising two insulation films each having a different thickness; and
   forming a gate electrode over the first and the second gate insulation films.

2. The method of manufacturing a semiconductor device of claim 1, wherein the forming of the second gate insulation film comprises forming a first insulation film of a first thickness, removing the first insulation film from a predetermined portion of the substrate and forming a second insulation film of a second thickness in a portion adjacent the remaining first insulation film, the second insulation film being thinner than the first insulation film.

3. The method of a semiconductor device of claim 1, wherein the second gate insulation film is formed after the first gate insulation film is formed.

4. The method of manufacturing a semiconductor device of claim 1, wherein the second gate insulation film is formed before the first gate insulation film is formed.

5. A method of manufacturing a semiconductor device, comprising:
   providing a substrate;
   forming a LOCOS insulation film at a predetermined region of a semiconductor layer of the substrate by selective oxidation using an oxidation resistant film as a mask;
   forming a first gate insulation film of a first thickness adjacent the LOCOS insulation film by thermally oxidizing the semiconductor layer after removing the oxidation resistant film;
   removing a portion of the first gate insulation film;
   forming a second gate insulation film of a second thickness at a portion of the substrate adjacent the remaining first gate insulation film by thermally oxidizing the semiconductor layer, the second gate insulating film being thinner than the first gate insulating film;
   forming a gate electrode over the gate insulation film of the first thickness, the gate insulation film of the second thickness and the LOCOS gate insulation film; and
   forming a source region and a drain region each adjacent the gate electrode.

6. The method of manufacturing a semiconductor device of claim 5, further comprising forming a pad insulation film or a pad insulation film and a pad polysilicon film on the semiconductor layer before forming the LOCOS insulation film.

* * * * *